(12) United States Patent
Dunsmore et al.

(10) Patent No.: US 7,868,607 B2
(45) Date of Patent: Jan. 11, 2011

(54) TEST METHOD FOR FREQUENCY CONVERTERS WITH EMBEDDED LOCAL OSCILLATORS

(75) Inventors: Joel P. Dunsmore, Sebastopol, CA (US); Sean Hubert, Santa Rosa, CA (US); Loren C. Betts, Rohnert Park, CA (US); Johan Ericsson, Windsor, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 811 days.

(21) Appl. No.: 11/738,051

(22) Filed: Apr. 20, 2007

(65) Prior Publication Data

US 2008/0258707 A1 Oct. 23, 2008

(51) Int. Cl.
*G01R 23/14* (2006.01)
*G01R 27/28* (2006.01)

(52) U.S. Cl. .............. 324/76.23; 324/76.43; 324/76.52; 324/617

(58) Field of Classification Search ............. 324/76.19, 324/76.23, 76.26, 76.43, 76.52, 617
See application file for complete search history.

(56) References Cited

U.S. PATENT DOCUMENTS

| | | | | |
|---|---|---|---|---|
| 5,028,886 | A * | 7/1991 | Seibel et al. | 331/4 |
| 5,089,782 | A * | 2/1992 | Pike et al. | 324/623 |
| 5,732,108 | A * | 3/1998 | Rapeli et al. | 375/316 |
| 5,937,006 | A * | 8/1999 | Clark et al. | 324/76.23 |
| 6,041,077 | A * | 3/2000 | Clark et al. | 324/76.23 |
| 6,064,694 | A * | 5/2000 | Clark et al. | 324/76.23 |
| 6,448,786 | B1 * | 9/2002 | Dunsmore et al. | 324/601 |
| 6,904,381 | B2 * | 6/2005 | Shank et al. | 702/108 |
| 6,968,278 | B1 * | 11/2005 | Christensen et al. | 324/95 |
| 7,061,222 | B2 * | 6/2006 | Shank et al. | 324/76.23 |
| 7,103,332 | B2 * | 9/2006 | Choi et al. | 455/192.2 |
| 7,212,075 | B2 * | 5/2007 | Young et al. | 331/176 |
| 7,415,373 | B2 * | 8/2008 | Yanamaka et al. | 702/75 |

* cited by examiner

*Primary Examiner*—Timothy J Dole

(57) ABSTRACT

A method is presented where the phase trace is offset for each sweep such that the first point is always at zero degrees. The resulting traces are then averaged. The average reduces the noise in the phase trace and results in a less noisy group delay trace.

14 Claims, 2 Drawing Sheets

TEST METHOD FOR FREQUENCY CONVERTERS WITH EMBEDDED LOCAL OSCILLATORS

BACKGROUND

Testing frequency converters with an embedded local oscillator (LO) present special problems when making phase and group delay measurements using a vector network analyzer (VNA) because the embedded LO frequency may not be well-known or stable.

If the frequency of the LO is unknown, it is possible to search the intermediate frequency (IF) for a peak signal and from the measured IF infer the LO frequency. Unfortunately, even phase-locked LO sources can drift in phase over time. This is because a phase/frequency detector may be used to generate an output voltage proportional to the phase difference between the internal oscillator and a reference frequency. The output voltage is integrated in a phase-lock loop to provide a constant phase offset, e.g. lock angle, and drives the internal oscillator's tune line to maintain zero deviation from the lock angle. However, the lock angle can drift due to analog circuit drift in the phase detector caused by temperature changes or spurious signals in the phase lock loop. If the lock angle drifts long enough, it can cause a phase "pop" or "slipped cycle" where the lock is momentarily lost.

When making group delay measurements on a mixer using a Vector Network Analyzer (VNA), a mixer path is added to the network analyzer reference path to provide a phase reference for the radio frequency (RF) to IF transfer function. Typically, the LO is split to drive both the device under test (b) and the reference channel mixer. For an embedded LO DUT, a reference channel LO of the same frequency as the DUT LO is used to drive the reference mixer, but any drift in either LO causes a phase variation of one IF relative to the other. For a group delay measurement, the RF is swept through a small range, which is effectively the group delay aperture and the IF phase change is measured. Previously, a calibration mixer would be used to normalize out the reference path response relative to the test path. Thus, any detected IF phase change is considered to be due to a DUT group delay (taught in U.S. patent application Ser. No. 09/591,441, issued as U.S. Pat. No. 6,690,722, and U.S. Pat. No. 6,448,786). For the calibration portion, the reference channel LO is used to drive both the reference and calibration mixer. However, when measuring the DUT, if the LO phase drifts during the measurement, the phase drift will cause IF phase changes and result in an erroneous group delay measurement.

SUMMARY

A method is presented where the phase trace is normalized for each sweep such that a chosen point is always at constant phase, with all the other trace points normalized by the same value. The resulting traces are then averaged. The average reduces the noise in the phase trace and results in a less noisy group delay trace, particularly when a large IF bandwidth is used on the VNA. A large IF BW results in a noisy trace, but is needed to capture a varying IF frequency due to local oscillator (LO) drift. This technique assumes that there is no monotonic drift of the embedded LO. Monotonic drift of the embedded LO may be compensated for by adjusting the signal generator LO each sweep based on additional fixed frequency measurements.

DETAILED DESCRIPTION

Figure 1A:
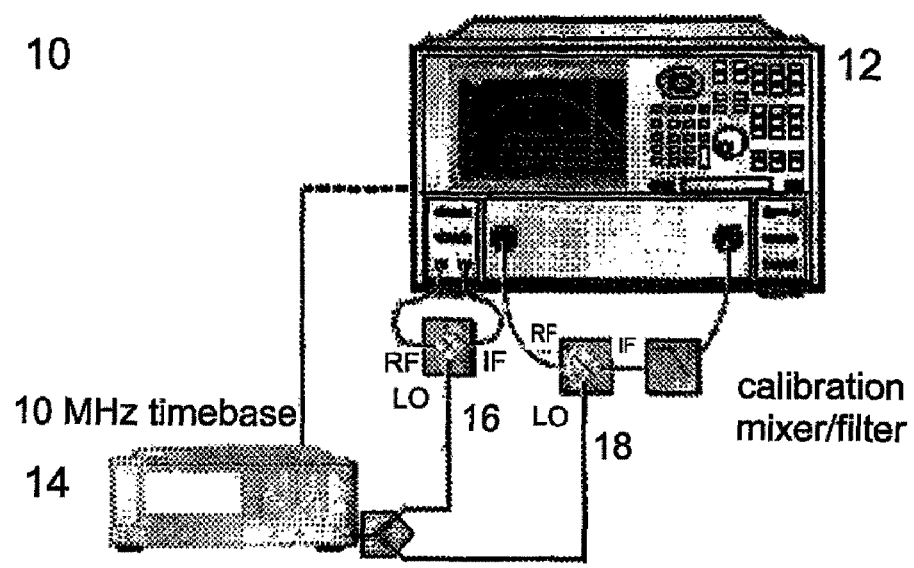
FIGS. 1A and 1B illustrate block diagrams of a measurement system with an embedded local oscillator (LO) (prior art).
Figure 1B:
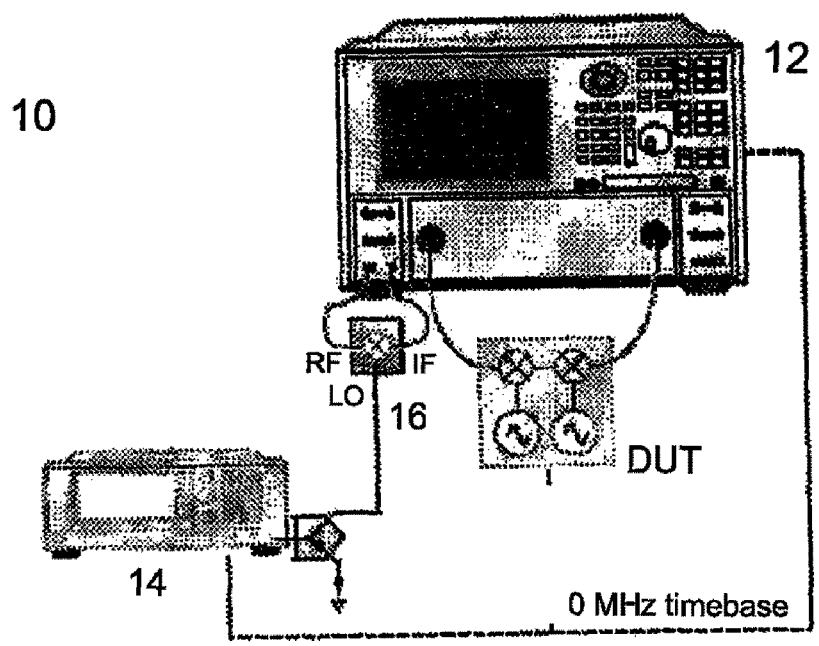

FIGS. 1A and 1B illustrates block diagrams of a measurement system with an embedded local oscillator (LO) (prior art). FIG. 1A illustrates the measurement system during calibration while FIG. 1B illustrates the measurement system while the device under test (DUT) is in place. The measurement system 10 includes a network analyzer 12, a signal generator source 14, a reference mixer 16, and a calibration mixer/filter combination 18.

Figure 2:
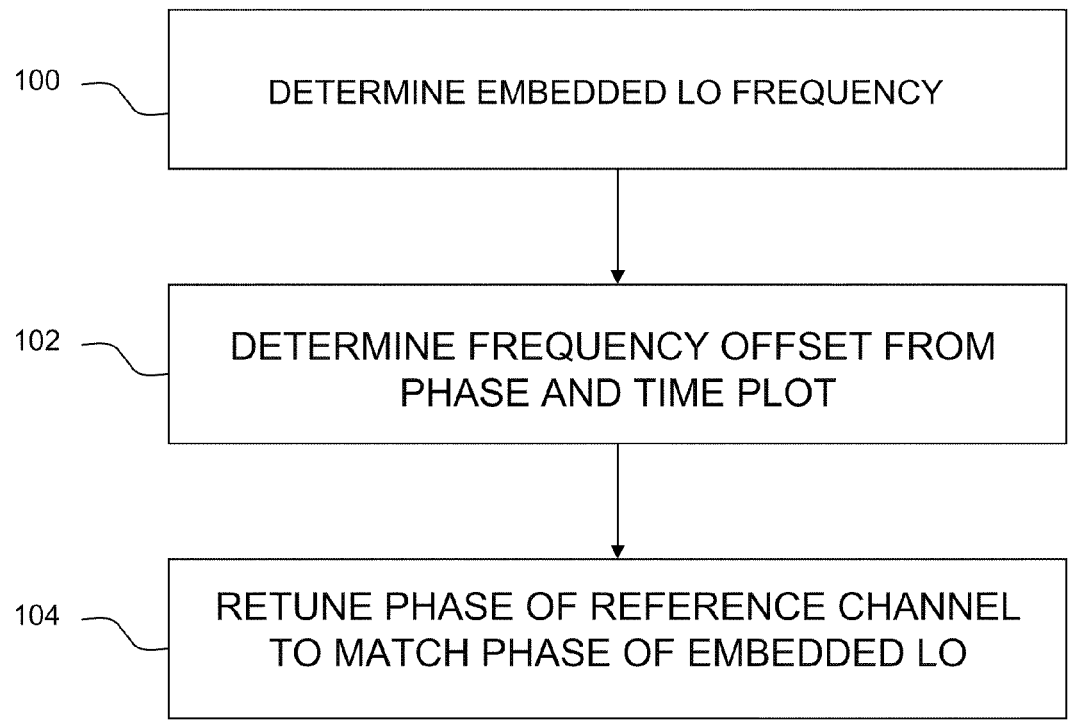
FIG. 2 illustrates a process flowchart according to the invention.

FIG. 2 illustrates a process flowchart according to the invention. In step 100, a measurement is made using Frequency Offset Mode to determine the embedded LO frequency. Frequency Offset Mode implies the source is held at the RF constant frequency, and the receiver is at the desired IF frequency. If the drift is sufficiently small, an additional measurement can be made using the vector frequency offset mode, comparing the DUT mixer with the response of the reference mixer, where a zero span measurement is made, and the phase vs. time is plotted.

In step 102, the exact frequency offset is determined from the phase vs. time plot.

In step 104, the phase of the reference channel of a signal generator is re-tuned to match the phase of the embedded LO.

The frequency error must be less than one half the IF bandwidth used to measure the response. If the frequency is off by more than that, the phase response will change by more than 180 degrees between measurement points and can yield an incorrect measurement. The frequency resolution is limited by the noise on the phase trace and the sweep time. The frequency offset (in Hz) between the reference channel and the test channel is determined by $$F \text{offset} = (d\phi/dt)/360$$

where $d\phi/dt$ is change in phase vs. change in time

For cases where the frequency may be off by more than one half IF bandwidth, the frequency measurement may be made as follows. One of the source or the receiver is maintained at a fixed frequency while the other is swept. The peak value of the amplitude is measured to determine the frequency of the IF. The frequency resolution is limited to the frequency span divided by the number of points.

The frequency of the reference channel LO is adjusted to match the embedded LO, and the frequency of the receiver is adjusted to match the offset between the source output (RF) and the embedded LO. After these adjustments are made, a normal frequency offset sweep is performed to measure the RF to IF phase response of the test mixer as described in U.S. patent application Ser. No. 09/591,441, issued as U.S. Pat. No. 6,690,772, and U.S. Pat. No. 6,448,786. The variation of the embedded LO often necessitates the IF BW of the receiver to be large, resulting in very noisy delay responses. Averaging is the only available method to reduce noise, but even minute frequency errors between the reference channel LO and the embedded LO will cause phase shifts in the RF to IF response. The resulting averaged signal will tend toward zero as the averages increase, due to the drifting phase of the two LO signals. This can be compensated for by defining a frequency point to be a reference value, and normalizing each sweep to the phase of the reference point, resulting in a constant phase at the reference point, and all other points have a deviation from this constant phase. This allows averaging to work correctly on a sweep-to-sweep basis.

We claim:

1. A method of measuring a response of a frequency converter, the method comprising:
for a vector network analyzer with a reference mixer of a receiver in one channel and a mixer of a device under test (DUT) in another channel, each mixer having a local oscillator;
measuring a response of a ratio of an output signal of the DUT mixer to an output signal of the reference mixer;
computing a phase response from the ratio of the output signal of the DUT mixer and the output signal of the reference mixer;
normalizing the phase response by a phase of a predetermined point in the phase response; and
averaging several traces of the phase response.

2. A method as in claim 1, further comprising determining a frequency of the local oscillator of the DUT mixer.

3. A method as in claim 2 further comprising offsetting the local oscillator of the reference mixer to match a frequency of the local oscillator of the DUT mixer.

4. A method as in claim 3 further comprising offsetting the receiver in frequency to match the output signal of the DUT mixer.

5. A method, as in claim 3, wherein offsetting the local oscillator of the reference mixer to match a frequency of the local oscillator of the DUT mixer comprises determining the frequency of the local oscillator of the DUT mixer.

6. A method as in claim 1 wherein the response of the ratio of the output signal of the DUT mixer and the output signal of the reference mixer is one of a phase and group delay response.

7. A method, as in claim 1, comprising:
setting one of a source and the receiver to a fixed frequency;
sweeping the other of the source and the receiver; and
measuring a peak value of an amplitude to determine an IF frequency.

8. A method, comprising:
for a network analyzer;
determining a frequency of a local oscillator within a device under test (DUT) mixer by measuring with the network analyzer an IF frequency output by the DUT;
offsetting one of a source and a receiver frequency used by a reference channel of the network analyzer to accommodate offsets in the local oscillator within the DUT mixer with respect to the source; and
measuring a response of the DUT mixer.

9. A method as in claim 8, wherein determining the frequency of the local oscillator within the DUT mixer comprises applying a frequency sweep to the DUT mixer.

10. A method as in claim 8, wherein determining the frequency of the local oscillator within the DUT mixer comprises applying a phase versus time sweep.

11. A method as in claim 8, wherein measuring the response of the DUT mixer comprises measuring a phase response, and further comprises normalizing the phase response by the phase at a predetermined point in the phase response.

12. A method as in claim 11, wherein measuring the response of the DUT mixer further comprises averaging the phase response.

13. A method for determining a frequency of an unknown signal, the method comprising:
applying the unknown signal to one channel of a vector network analyzer;
applying a signal of known frequency to another channel of the vector network analyzer;
measuring a phase versus time response of a ratio of the unknown signal and the signal of known frequency; and
determining a frequency offset between the unknown signal and the signal of known frequency based on a change of phase versus a change in time.

14. A method as in claim 13 wherein:
the unknown signal is an output of a mixer of a device under test; and
the known signal is an output of a mixer of a reference channel.

* * * * *